United States Patent
Pan

(10) Patent No.: US 10,839,888 B1
(45) Date of Patent: Nov. 17, 2020

(54) INTERPOLATION-BASED TEMPERATURE-DEPENDENT POWER SUPPLY GENERATION

(71) Applicant: Micron Technology, Inc., Boise, ID (US)

(72) Inventor: Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/518,740

(22) Filed: Jul. 22, 2019

(51) Int. Cl.
  *G11C 11/4074* (2006.01)
  *H03M 7/16* (2006.01)

(52) U.S. Cl.
  CPC ......... *G11C 11/4074* (2013.01); *H03M 7/165* (2013.01)

(58) Field of Classification Search
  CPC .................... G11C 11/4074; H03M 7/165
  See application file for complete search history.

(56) References Cited

U.S. PATENT DOCUMENTS

| 7,176,765 B1* | 2/2007 | Shorb | H03B 5/04 331/111 |
| 7,492,657 B2* | 2/2009 | Sako | G11C 7/04 365/189.09 |
| 8,397,571 B2* | 3/2013 | Murayama | H03F 3/005 73/495 |
| 10,037,045 B2* | 7/2018 | Wan | G05F 1/465 |
| 2011/0050286 A1* | 3/2011 | Son | G01K 7/01 327/72 |
| 2016/0065181 A1* | 3/2016 | Lee | H03K 19/00369 327/307 |

\* cited by examiner

*Primary Examiner* — Tri M Hoang
(74) *Attorney, Agent, or Firm* — Fletcher Yoder, P.C.

(57) ABSTRACT

Systems and methods relate to interpolating values in a transfer function between a first parameter (e.g., temperature) and a second parameter (e.g., voltage). A decoder is configured to receive a temperature value and multiple trim codes each corresponding to one temperature. Decoder and adder circuitry is configured to receive the temperature value from the decoder and to receive two closest trim codes of the plurality of trim codes corresponding to two closest temperatures of the temperatures that are closest to the temperature value. The decoder and adder circuitry then calculates an output trim code based at least in part on the two closest trim codes; outputs the trim code.

20 Claims, 7 Drawing Sheets

FIG. 8

| SETTING | TEMP | TRIM | |
|---|---|---|---|
| SETTING | 90C | 25 | ← 207 |
| SETTING | 82C | 22 | ← 208 |
| | | | |
| INPUT | 89C | 24 | ← 226A |
| INPUT | 88C | 24 | ← 226B |
| INPUT | 87C | 23 | ← 226C |
| INPUT | 86C | 23 | ← 226D |
| INPUT | 85C | 23 | ← 226E |
| INPUT | 84C | 22 | ← 226F |
| INPUT | 83C | 22 | ← 226G |

| TEMPERATURE (C) | VALUE |
|---|---|
| 122 | 5 OR 6 BITS |
| 114 | 5 OR 6 BITS |
| 106 | 5 OR 6 BITS |
| 98 | 5 OR 6 BITS |
| 90 | 5 OR 6 BITS |
| 82 | 5 OR 6 BITS |
| 74 | 5 OR 6 BITS |
| 66 | 5 OR 6 BITS |
| 58 | 5 OR 6 BITS |
| 50 | 5 OR 6 BITS |
| 42 | 5 OR 6 BITS |
| 34 | 5 OR 6 BITS |
| 26 | 5 OR 6 BITS |
| 18 | 5 OR 6 BITS |
| 10 | 5 OR 6 BITS |
| 2 | 5 OR 6 BITS |
| −6 | 5 OR 6 BITS |
| −14 | 5 OR 6 BITS |
| −22 | 5 OR 6 BITS |
| −30 | 5 OR 6 BITS |
| −38 | 5 OR 6 BITS |

202

INTERPOLATION-BASED TEMPERATURE-DEPENDENT POWER SUPPLY GENERATION

BACKGROUND

The present disclosure relates generally to the field of bandgap circuits and, more particularly, to techniques for generating power (e.g., voltage) using interpolation for temperature dependency for the power supply.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices, such as semiconductor devices, memory chips, microprocessor chips, image chips, and the like, may include circuitry that undergoes variation of a first parameter (e.g., temperature). The electronic devices perform various operations using a second parameter (e.g., voltage). A level of the second parameter used by the electronic device may vary with changes in a first parameter. Thus, the first parameter may be sensed and/or tracked and cause changes in the second parameter, accordingly. To achieve such changes, a transfer function may be used to control the second parameter according to changes in the first parameter.

BRIEF DESCRIPTION OF DRAWINGS

Various aspects of this disclosure may better be understood upon reading the following detailed description and upon reference to the drawings in which:

FIG. 7 is a table of example temperature values used in the voltage generator circuitry of FIG. 6, in accordance with an embodiment; and FIG. 8 is a table of example trim values used in the voltage generator circuitry of FIG. 6, in accordance with an embodiment.

DETAILED DESCRIPTION

One or more specific embodiments will be described below. To provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure generally relates to interpolation of a first parameter (e.g., voltage) according to detected values of a second parameter (e.g., temperature) to provide flexibility and precision in controlling the variation of the first parameter without consuming an inordinate amount of resources to store features of a transfer function used to determine the first parameter based on the first parameter. As discussed herein, the first parameter is discussed in relation to a voltage level, and the second parameter is discussed in relation to a temperature. However, the first and/or second parameters may be applicable to any two related parameters. For instance, in the following example, a voltage may be varied to maintain constant performance despite a temperature change in a semiconductor device (e.g., memory device) where the performance of the semiconductor device uses less voltage at higher temperatures.

Figure 1:
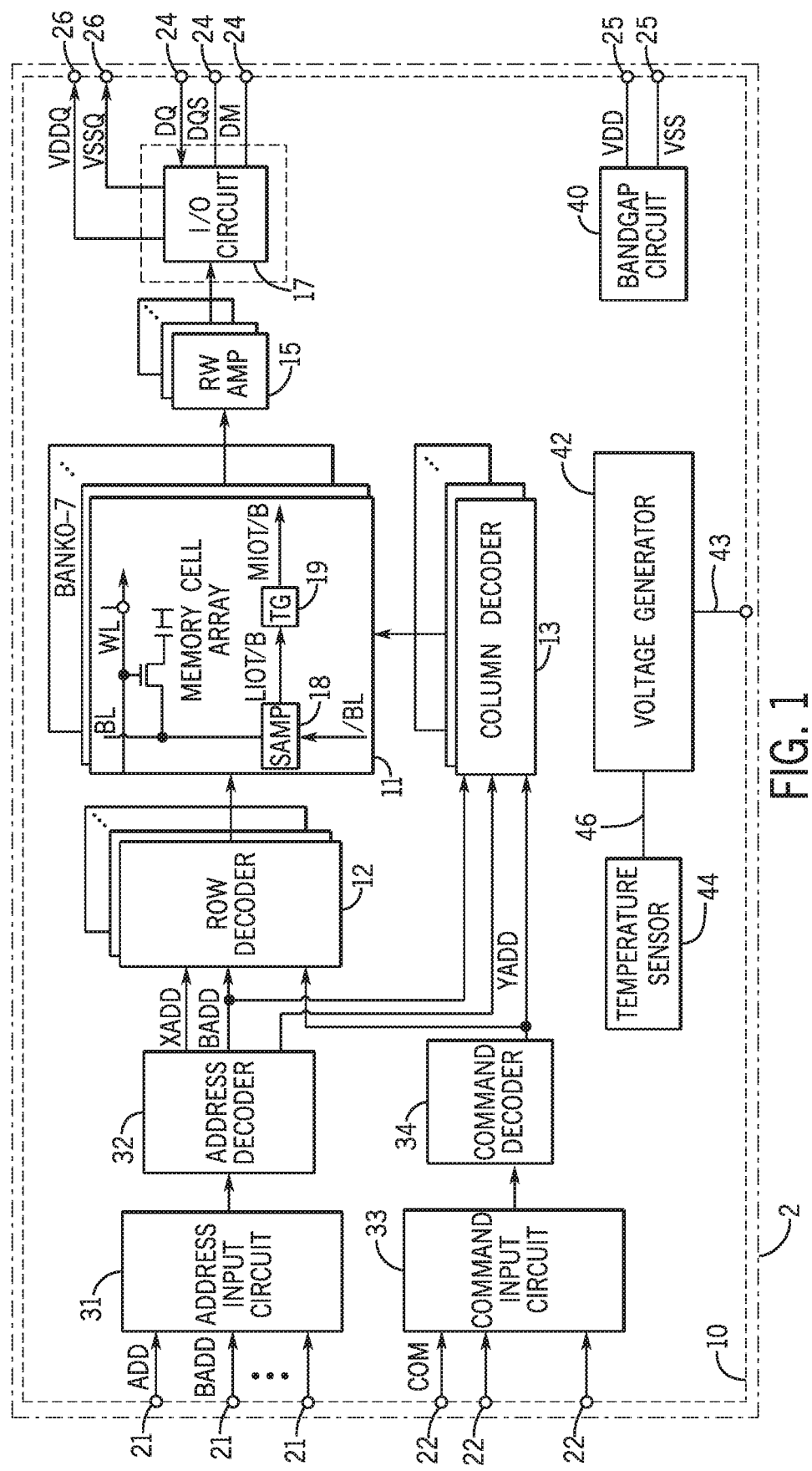
FIG. 1 is a simplified block diagram illustrating a semiconductor device that includes voltage generation circuitry, in accordance with an embodiment of the present disclosure.

With this in mind, FIG. 1 illustrates a semiconductor device 10, in accordance with an embodiment of the present disclosure. Although the following description of the semiconductor device 10 will be described in the context of a memory device, it should be noted that the embodiments described herein may be employed for any suitable electronic device. Indeed, the description of the memory device below is provided to explain certain aspects of the present disclosure, and, as such, the embodiments described herein should not be limited only to memory devices.

In embodiments where the semiconductor device 10 is a memory device, the semiconductor device 10 may be any suitable memory device, such as a double data rate type 4 (DDR4) synchronous dynamic random-access memory (SDRAM) integrated device, a double data rate type 5 (DDR5) SDRAM device, a low-power double data rate type 4 (LPDDR4) SDRAM device, a low-power double data rate type 5 (LPDDR5), and/or other suitable memory device. Additionally or alternatively, as previously noted, the voltage generation scheme discussed herein may be applied to any suitable electronic device that utilizes voltage generation that varies according to at least one parameter (e.g., temperature).

The semiconductor device 10 may be mounted on an external substrate 2, such as a memory module substrate, a motherboard, and the like. The semiconductor device 10 may include a plurality of memory banks each having a plurality of memory cell arrays 11. Each memory cell array 11 may include a plurality of word lines (WL), a plurality of bit lines (BL), and a plurality of memory cells MC arranged at intersections of the plurality of WL and the plurality of BL. The selection of the WL is performed by a row decoder 12 and the selection of the bit line BL is performed by a column decoder 13. Sense amplifiers (SAMP) 18 are coupled to corresponding BL and connected to local input/output (I/O) line pairs (LIOT/B). LIOT/B are connected to main IO line pairs (MIOT/B) via transfer gates (TG) 19, which function as switches to control signal flow.

The semiconductor device 10 may also include multiple external terminals, which may communicate with other electrical components/devices. The external terminals may, in turn, include address terminals 21, command terminals 22, data terminals 24, and power supply terminals 25, 26. In particular, the address terminals 21 receive an address signal ADD and a bank address signal (BADD). The address signal ADD and the BADD received by the address terminals 21 are transferred via an address input circuit 31 to an address decoder 32. The address decoder 32 receives the address signal ADD and supplies a decoded row address signal XADD to the row decoder 12 as well as a decoded column address signal YADD to the column decoder 13. The address decoder 32 also receives the BADD and supplies the BADD to the row decoder 12 and the column decoder 13.

The command terminals 22 are supplied with a command signal (COM). The COM may include one or more separate signals. The COM input to the command terminals 22 is transferred to a command decoder 34 via the command input circuit 33. The command decoder 34 decodes the COM to generate various internal command signals. For example, the internal commands may include a row command signal to select a word line WL and a column command signal, such as a read command or a write command, to select a bit line BL. Additionally, the data terminals 24 may be coupled to output buffers for read operations of memories or to input buffers for read/write access of the memories.

Although the address terminals 21 and the command terminals 22 are illustrated as separate terminals, it should be appreciated that in some embodiments, the address input circuit 31 and the command input circuit 33 may receive address signals ADD and command signals COM via the same terminal. For instance, the address and command terminals may provide an address signal at a falling clock edge (e.g., in synchronism with clock falling edge) and a command signal at a rising clock edge (e.g., in synchronism with clock rising edge). Further, the data terminals 24 may also be a single terminal that alternatively receives data signals (DQ, DQS, DM).

Accordingly, the address signals ADD, BADD and the command signals COM may be used to access a memory cell MC in the memory cell array 11. As an example, when a COM indicating a read operation is timely supplied to a word line WL and a bit line BL designated by a respective row address and column address of the address signal ADD, data may be read from the memory cell MC associated with the row address and column address. The read data DQ may be output externally from the data terminals 24 via a read/write amplifier 15 and an input/output circuit 17. Similarly, when a COM indicating a write operation is timely supplied to a word line WL and a bit line BL designated by a respective row address and column address of the address signal ADD, DQ may be written to the memory cell MC associated with the row address and column address. The write data DQ may be supplied to the memory cell MC after being received from the data terminals 24, the input/output circuit 17, and the read/write amplifier 15.

In some embodiments, the input/output circuit 17 may include input buffers that store data for processing and/or transmission. Further, the input/output circuit 17 receives a timing signal from an external clock that controls input timing of read data DQ and output timing of write data DQ. The input/output circuit 17 may be powered using dedicated power supply potentials VDDQ and VSSQ, such that power supply noise generated by the input/output circuit 17 does not propagate to the other circuit blocks. The power supply potentials VDDQ and VSSQ may be of the same potentials as power supply potentials VDD and VSS that are supplied to power supply terminals 25, respectively.

In particular, the power supply potentials VDD and VSS may be supplied to a bandgap circuit 40 by a voltage generator 42. In some embodiments, a generated voltage 43 from the voltage generator 42 may be provided to the bandgap circuit 40 using shared voltage rails, as illustrated. Additionally or alternatively, the generated voltage 43 may be provided only to the bandgap circuit 40 from the voltage generator 42. Since the generated voltage 43 may vary with temperature of the semiconductor device 10, the semiconductor device 10 may utilize a temperature sensor 44 that is part of the semiconductor device 10 and/or coupled to the voltage generator 42 to transmit temperature indicators 46 to the voltage generator 42.

Figure 2:
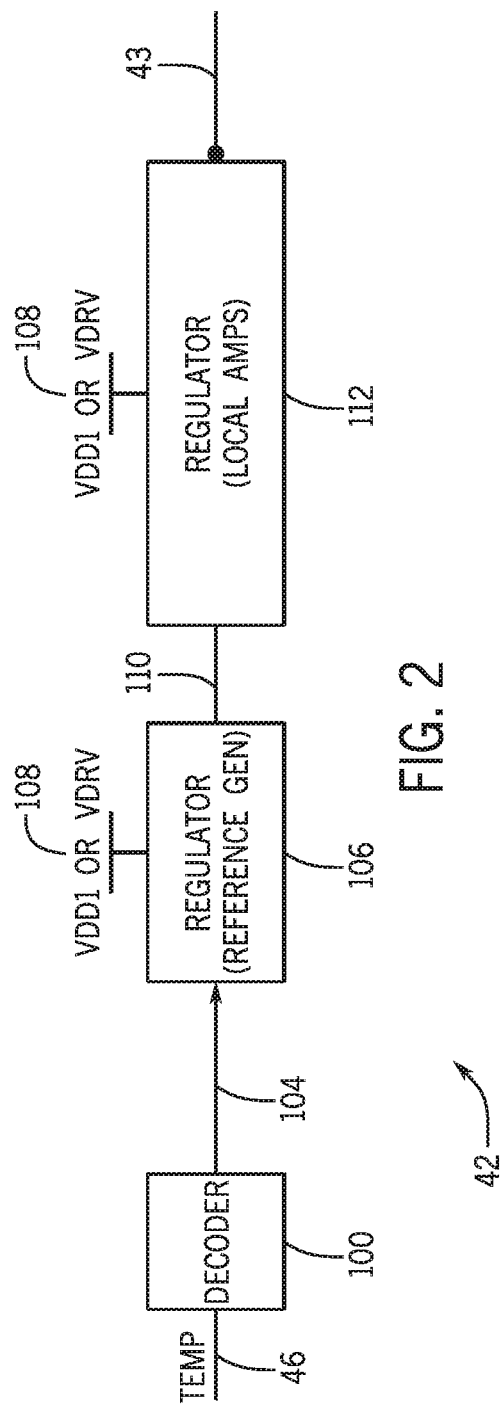
FIG. 2 is a simplified block diagram illustrating the voltage generator of FIG. 1, in accordance with an embodiment of the present disclosure.

The voltage generator 42 may include one or more sub-components to enable usage of the temperature indicators 46 to drive the generated voltage 43 to a temperature-dependent level. For instance. FIG. 2 illustrates a potential embodiment of the voltage generator 42 that may be used to generate the generated voltage 43. As illustrated, the voltage generator 42 includes a decoder 100 that receives the temperature indicators 46 and outputs control signals 104 to cause a regulator to generate a reference voltage 110 based on the control signals 104 and a supply voltage 108. Other regulator(s) (e.g., local amplifiers) receive the reference voltage 110 and generate the generated voltage 43. Although the illustrated embodiment of the voltage generator 42 includes two regulators, other embodiments may include any suitable number of regulators to generate the generated voltage 43 using the control signals 104 based at least in part on the temperature indicators 46.

Figure 3:
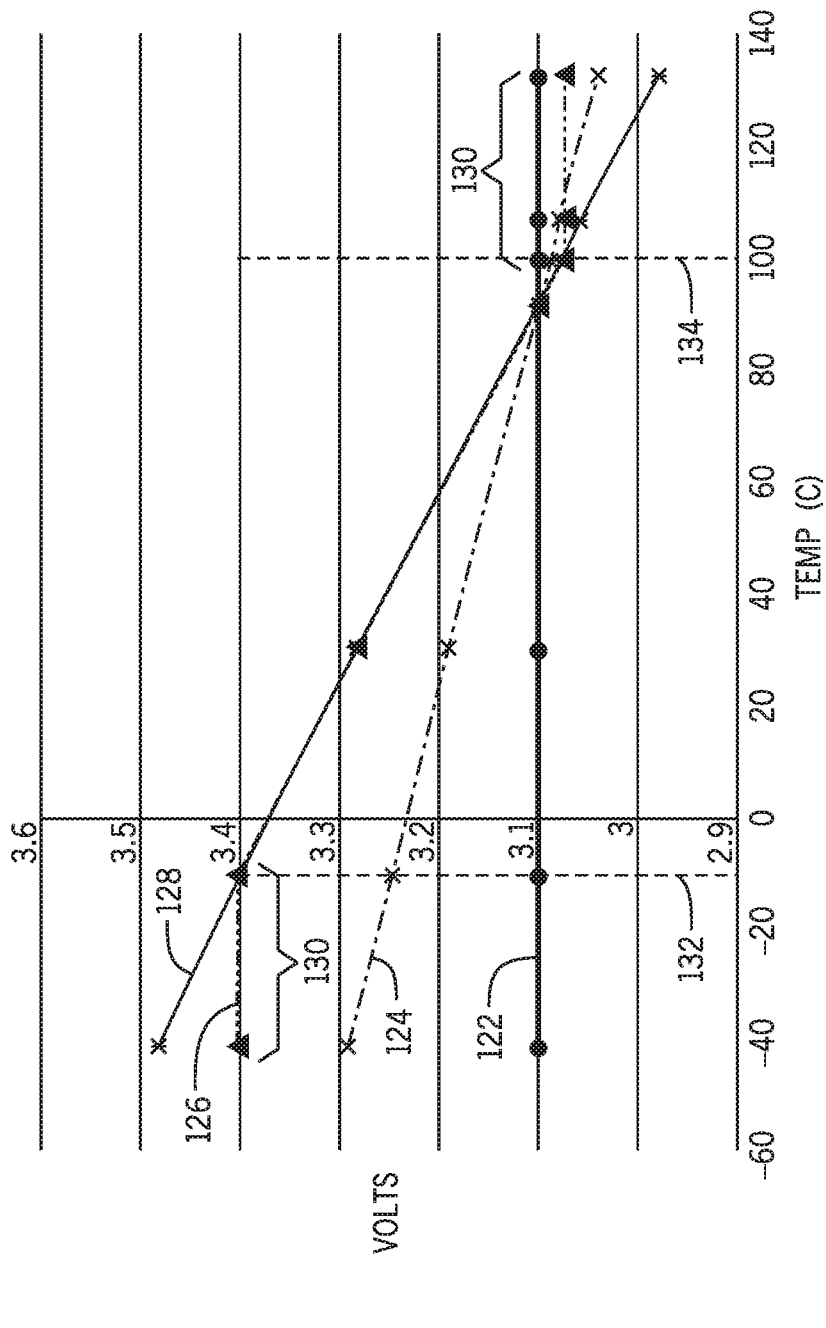
FIG. 3 is a graph of analog transfer functions for voltage relative to temperature, in accordance with an embodiment of the present disclosure.

The control signals 104 may set a voltage level based at least in part on temperature. The level of the generated voltage 43 may be a result of a transfer function of temperature to voltage level. For instance, FIG. 3 illustrates a graph 120 of analog transfer functions 122, 124, 126, and 128 that may be used to control a level of the generated voltage 43 based on the temperature indicators 46. As illustrated, as the temperature indicated in the temperature indicators 46 increases, the voltage generator 42 drives and/or generates a lower generated voltage 43. As illustrated, the analog transfer functions 122, 124, 126, and 128 have defined slopes. Some analog transfer functions may include clamping regions 130 that trim/clamp voltage to a first level for temperatures below a low threshold 132 or to a second level for temperatures above a high threshold 134. However, as illustrates, the slopes of the analog transfer functions 122, 124, 126, and 128 are static with limited flexibility.

Figure 4:
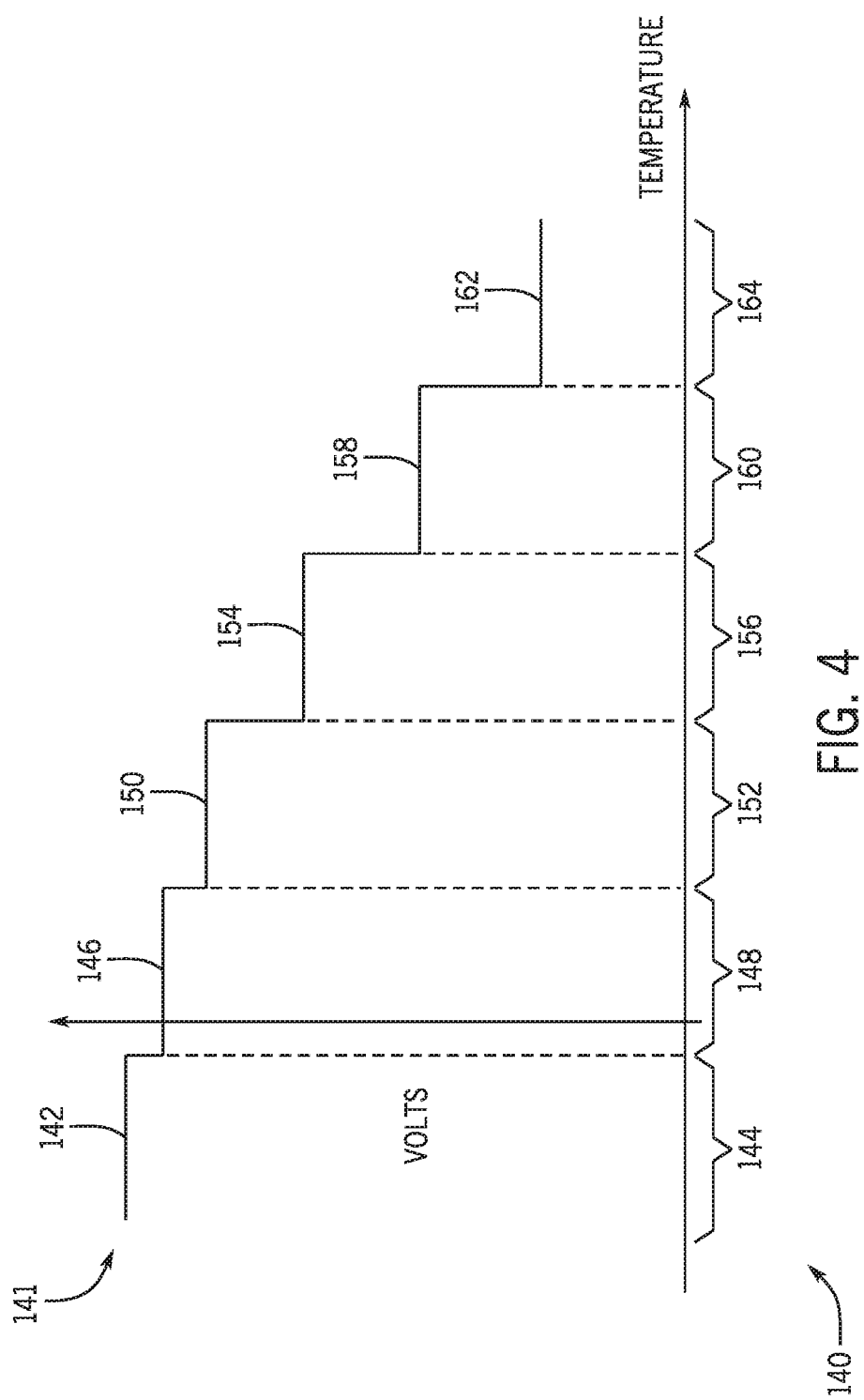
FIG. 4 is a graph of a step-wise transfer function for voltage relative to temperature, in accordance with an embodiment of the present disclosure.

To increase flexibility of slopes used, digital transfer functions may be used. For example, FIG. 4 illustrates a graph 140 of a digital transfer function 141 that may be used to control the level of the generated voltage 43 based on the temperature indicators 46. The digital transfer function 141 includes a first voltage level 142 for a first range 144 of temperatures. The digital transfer function 141 includes a second voltage level 146 for a second range 148 of temperatures where the second voltage level 146 is lower than the first voltage level 142, and the second range 148 corresponds to higher temperatures than the first range 144 of temperatures. The digital transfer function 141 includes a third voltage level 150 for a third range 152 of temperatures where the third voltage level 150 is lower than the second voltage level 146, and the third range 152 corresponds to higher temperatures than the second range 148. The digital transfer function 141 includes a fourth voltage level 154 for a fourth range 156 of temperatures where the fourth voltage level 154 is lower than the third voltage level 150, and the fourth range 156 corresponds to higher temperatures than the third range 152 of temperatures. The digital transfer function 141 includes a fifth voltage level 158 for a fifth range 160 of temperatures where the fifth voltage level 158 is lower than the fourth voltage level 154, and the fifth range 160 corresponds to higher temperatures than the fourth range 156 of temperatures. The digital transfer function 141 includes a sixth voltage level 162 for a sixth range 164 of temperatures where the sixth voltage level 162 is lower than the fifth voltage level 158, and the sixth range 164 corresponds to higher temperatures than the fifth range 160 of temperatures. Although the illustrated embodiment of the digital transfer function 141 includes 6 voltage levels 142, 146, 150, 154, 158, and 162 corresponding to six ranges 144, 148, 152, 156, 160, and 164 of temperatures, the digital transfer function may include other numbers of steps. However, the steps may be coarse between voltage levels. To accommodate smaller steps, more levels may be utilized. However, additional steps utilize more memory/dedicated resources for the semiconductor device 10.

Figure 5:
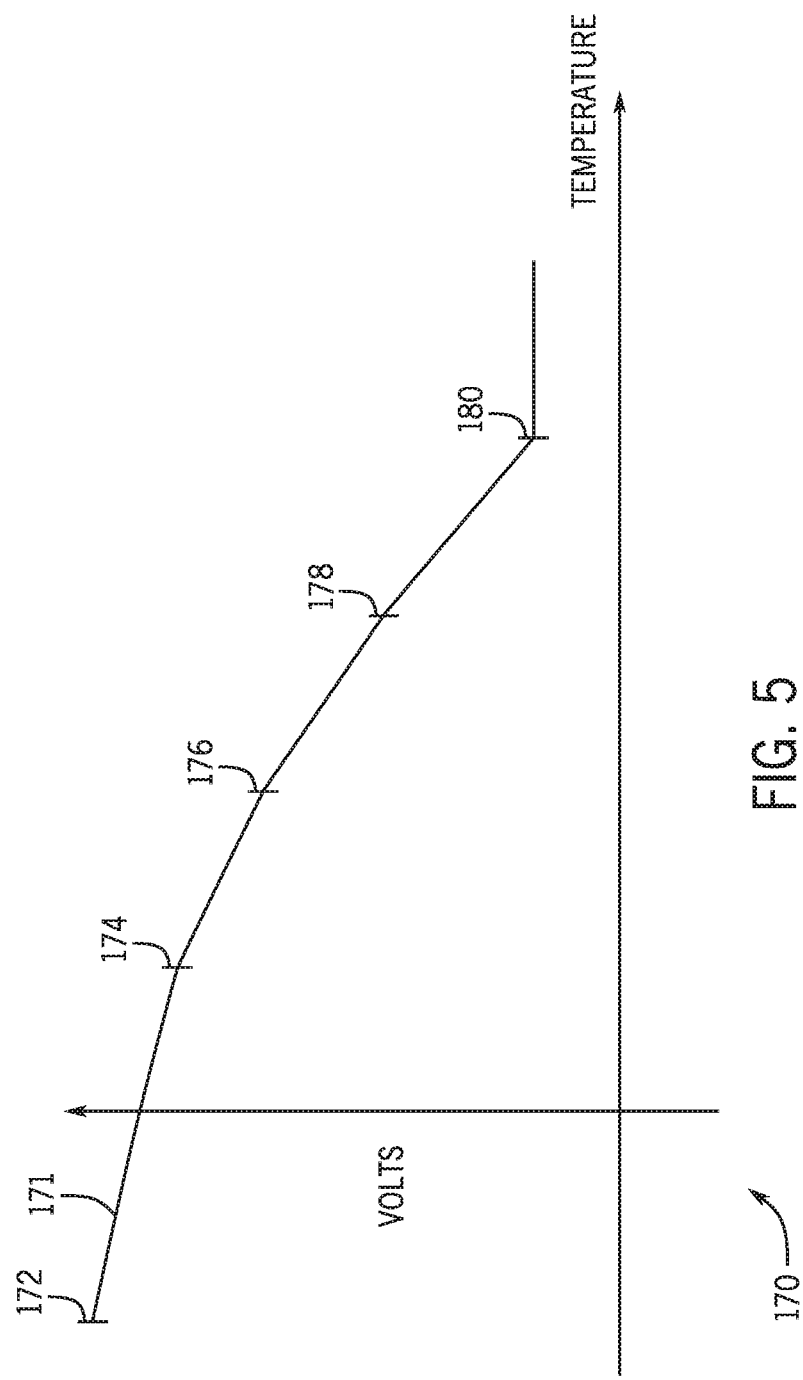
FIG. 5 is a graph of an interpolation-based transfer function for voltage relative to temperature, in accordance with an embodiment of the present disclosure.

To utilize increased flexibility similar to the digital transfer functions without the coarse steps/increased resource consumption of digital transfer functions, an interpolation-based transfer function may be used. FIG. 5 illustrates an embodiment of a graph 170 that includes an interpolation-based transfer function 171. The interpolation-based transfer function 171 includes set points 172, 174, 176, 178, and 180 that have set voltage levels that correspond to specified temperature points. All values between the set points 172, 174, 176, 178, and 180 may be determined using interpolation. Based on the set points, a curve of the interpolation-based transfer function 171 may be flexibly set without including coarse steps.

Figure 6:
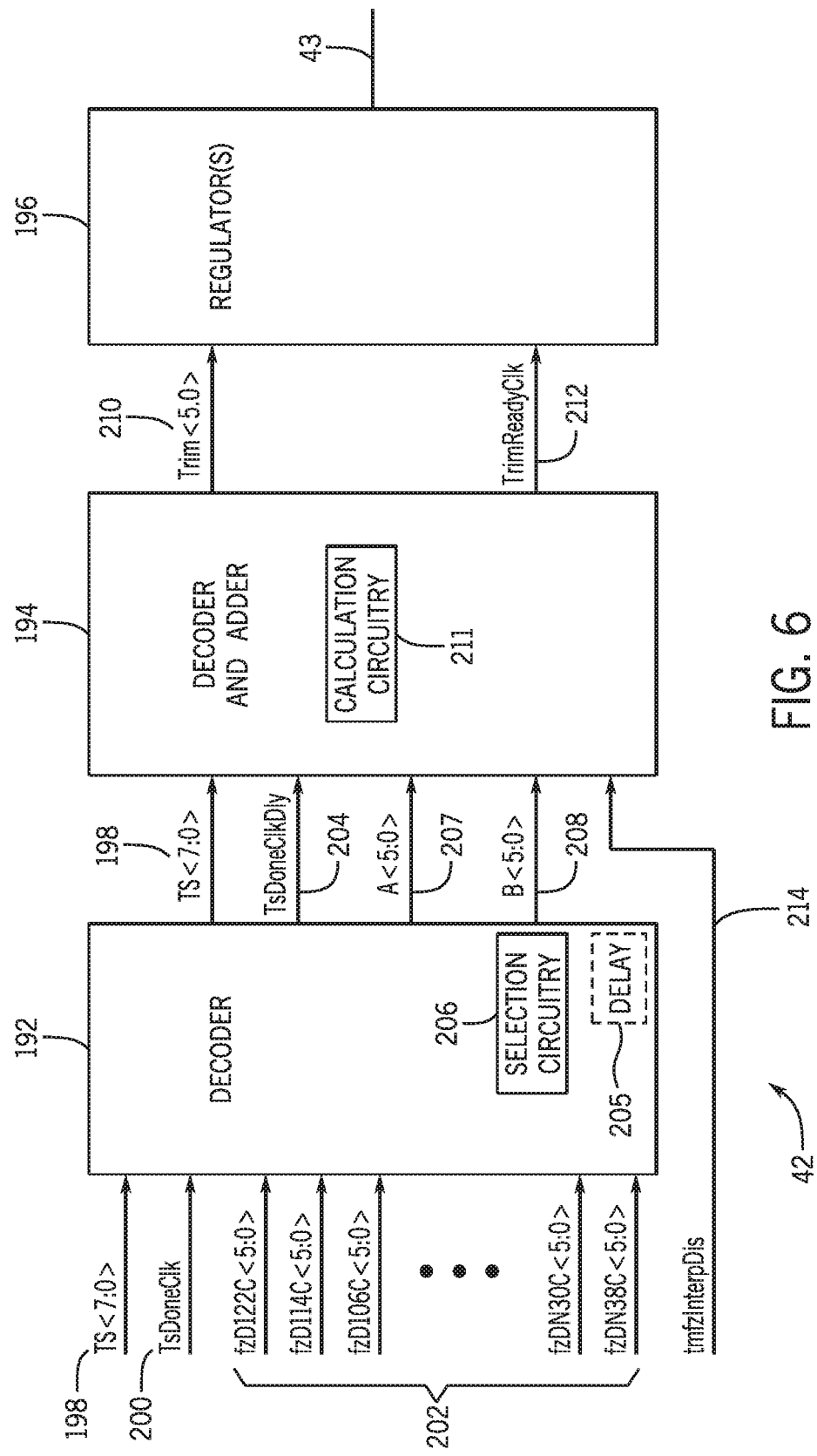
FIG. 6 is a diagram of the voltage generator circuitry of FIG. 1, in accordance with an embodiment.

FIG. 6 illustrates a block diagram of the voltage generator 42 that generates the generated voltage 43 using the interpolation-based transfer function 171. The voltage generator 42 includes a decoder 192, a decoder and adder 194, and a regulator 196. The decoder 192 receives a temperature code 198 (e.g., the temperature indicators 46) that indicates a temperature from the temperature sensor 44. For instance, the temperature code 198 may include a number (e.g., 8) of bits suitable for indicating temperatures that the semiconductor device 10 is likely to experience. The decoder 192 further receives a temperature sensing done signal 200 that indicates whether temperature sensing has been completed by the temperature sensor 44. The decoder 192 also receives trim codes 202 that indicate set points for the interpolation-based transfer function 171 and their corresponding voltage levels.

For example, FIG. 7 illustrates an example set of trim codes 202 that may be received by the decoder 192. As illustrated, the trim codes 202 include set points 202A (e.g., set points 172, 174, 176, 178, and 180) at an intervals of the possible temperature values and a corresponding trim value 202B used to set a level for the generated voltage 43. For example, the trim codes 202 in FIG. 7 have a set interval of eight that has a trim code at every $8^{th}$ degree of possible temperature codes 198. By setting the interval to eight, at least two (e.g., three) most least significant bits (LSB) may be ignored in designating the trim codes 202, and the remaining most significant bits (MSB) may be used to index the trim codes 202 consecutively. Other intervals having a power of two, $2^x$, may be used with n–x MSB or n–(x–1) used to index the trim codes 202 where n is the number of bits in the trim code 202 and x is the exponent of two of the interval value. The exponent x may be an integer (e.g., 3). Alternatively, the trim codes 202 may include different set interval amounts (e.g., 1, 3, 4, 5, or more temperature integers between trim codes 202) for the trim codes 202 or varying intervals between trim codes 202 to set different curves for the interpolation-based transfer function 171. A length of the trim value 202B in the trim code 202 may be set according to a level of granularity available used in setting the generated voltage 43. For instance, a longer trim value 202B may be used to more precisely set the generated voltage 43. The amount of granularity used to set the generated voltage 43 may be selected according to the application to which the voltage generator 42 is to be applied. For example, the amount of granularity may correspond to a number of steps available in voltage generation of the voltage generator 42.

Returning to FIG. 6, the decoder 192 transmits the temperature code 198 to the decoder and adder 194. The decoder 192 also transmits, to the decoder and adder 194, a delayed temperature sensing done signal 204 that indicates that the temperature sensing done signal 200 has passed through the decoder 192. The delayed temperature sensing done signal 204 may be delayed solely by the amount of delay inherent in passing the temperature sensing done signal 200 through the decoder 192. Additionally or alternatively, the decoder 192 may include delay(s) 205 that may be used to delay the temperature sensing done signal 200 before outputting the delayed temperature sensing done signal 204 to the decoder 192. The delay induced by the delay(s) 205 may be suitable to ensure that the selection of the trim codes 207 and 208 may be performed and the trim codes 207 and 208 may be output before the decoder and adder 194 begins trim code calculation (i.e., interpolation).

The decoder 192, using selection circuitry 206, selects the two trim codes that have temperatures closest to the temperature indicated in the temperature code 198. The selection circuitry 206 may include one or more multiplexers or other hardware suitable for selecting the two trim codes that have temperatures closest to the temperature indicated in the temperature code 198. Additionally or alternatively, the selection circuitry 206 may utilize software processing to perform the selection. For instance, the selection may be at least partially performed by storing the trim codes 202 table and looking up the values in the table using a processor. The decoder 192 then transmits, to the decoder and adder 194, the two trim codes that have temperatures closest to the temperature indicated in temperature code 198 as trim codes 207 and 208. When the temperature code 198 indicates a temperature that corresponds directly with one of the trim codes 202, the decoder 192 may select the trim code 202 with the exact match and either adjacent trim code 202 as the trim codes 207 and 208.

The decoder and adder 194 then performs interpolation on the trim codes 207 and 208 to generate an output trim code 210. The interpolation may be performed using calculation circuitry 211. The calculation circuitry 211 may include hardware, software, or a combination thereof that is configured to perform computations based at least in part on the trim codes 207 and 208. For example, the calculation circuitry 211 may perform a weighted average of the trim codes 207 and 208 by weighting the trim codes 207 and 208 in the weighted average according to how close the temperatures of the trim codes 207 and 208 are to the temperature indicated in the temperature code 198. In other words, the closer the temperature in the trim code 207 is to the temperature indicated in the temperature code 198, the more heavily weighted the trim code 207 (and less heavily the trim code 208) is in the interpolation.

The interpolation may be calculated using Equation 1:

$$\text{Trim} = \frac{A * (\text{Temp}_{sub}) + B * (\text{Interval} - \text{Temp}_{sub})}{\text{Interval}}, \quad \text{(Equation 1)}$$

where Trim is the output trim code 210. A is the trim code 207. B is the trim code 208, $\text{Temp}_{sub}$ is the sub-component of the temperature code 198 that falls between the temperatures, and Interval is the number of temperature values between trim codes 202. When the Interval is a power of two, the $\text{Temp}_{sub}$ may be determined by using the LSB values that are not used to index the trim codes 202. Additionally or alternatively, the $\text{Temp}_{sub}$ may be calculated by applying a modulo function to the temperature code 198 to determine a remainder above the closest power of two less than the temperature code 198. Thus, if the $\text{Temp}_{sub}$ bis a power of two (e.g., multiple of the interval), the $\text{Temp}_{sub}$ bis equal to zero and the Trim is equal to B. Although the foregoing discusses a power of two with the interval being $2^3$, similar techniques may be applied using different power and/or intervals. Furthermore, multiplication may be avoided to increase speed of processing. In other words, although the foregoing discusses that the weighted average interpolation is implemented using multiplication, the multiplication may be omitted by instead performing adding A together $\text{Temp}_{sub}$ times and adding B together (Interval–$\text{Temp}_{sub}$) times. The decoder and adder 194 may also output a trim ready clock 212 that indicates that the output trim code 210 is ready and has been/is currently being output from the decoder and adder 194. In other words, the trim ready clock 212 indicates that the regulator 196 may being outputting the generated voltage 43. In some embodiments, a disable signal 214 may be used to disable the decoding for various modes (e.g., debugging mode).

FIG. 8 illustrates a table 220 of example values for the trim codes 207 and 208. The table 220 includes temperatures 222 and trim values 224 for the trim codes 207 and 208 and interpolated values 226. In the illustrated embodiment, the Interval is 8, A is 25, and B is 22. Accordingly, the trim may be computed to be equal to Equation 2 below:

$$\text{Trim} = \frac{25 * (\text{Temp}_{sub}) + 22 * (8 - \text{Temp}_{sub})}{8}, \quad \text{(Equation 2)}$$

The interpolated values 226 are computed using the Equation 2. For example, the output trim code 210 for the temperature of 89° C., the $\text{Temp}_{sub}$ is 7, and (25*7+22*1)/8=24.625. A rounding rule (e.g., round down, round up, round-to-nearest integer) may be applied to the output trim code 210. For instance, the illustrated interpolated value 226A of 24.625 may be rounded down to 24. Similarly, the interpolated value 226B of 24.25 may be rounded down to 24; the interpolated value 226C of 23.875 may be rounded down to 23; the interpolated value 226D of 23.5 may be rounded down to 23; the interpolated value 226E of 23.125 may be rounded down to 23; the interpolated value 226F of 22.75 may be rounded down to 22; and the interpolated value 226G of 22.375 may be rounded down to 22.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus, comprising:
   a decoder configured to receive a temperature value and a plurality of trim codes each corresponding to one of a plurality of temperatures;
   decoder and adder circuitry configured to:
   receive the temperature value from the decoder;
   receive two closest trim codes of the plurality of trim codes corresponding to two closest temperatures of the plurality of temperatures that are closest to the temperature value;
   calculate an output trim code based at least in part on the two closest trim codes; and
   output the output trim code.

2. The apparatus of claim 1, wherein calculating the output trim code comprises interpolating the output trim code from the two closest trim codes and the temperature using calculation circuitry of the decoder and adder circuitry.

3. The apparatus of claim 1, comprising a voltage regulator that is configured to:
   receive the output trim code;
   generate a generated voltage to a level based at least in part on the output trim code; and
   output the generated voltage.

4. The apparatus of claim 1, comprising a sensor configured to determine a temperature for an electronic device including the apparatus.

5. The apparatus of claim 4, wherein the decoder is also configured to receive a temperature sensing done signal from the sensor that indicates that temperature sensing has been completed.

6. The apparatus of claim 5, wherein the decoder is configured to delay the temperature sensing done signal and output a delayed sensing done signal to indicate that the temperature value and the two closest trim codes are output.

7. The apparatus of claim 6, wherein the decoder and adder circuitry is configured calculate and output the output trim code based at least in part on receiving the delayed sensing done signal.

8. The apparatus of claim 7, wherein the delayed sensing done signal is delayed from the temperature sensing done signal by an amount of delay that ensures that the decoder outputs the two closest trim codes to the decoder and adder circuitry before calculating the output trim code.

9. The apparatus of claim 1, wherein an interval between adjacent values of the plurality of temperatures comprises a power of two.

10. The apparatus of claim 9, wherein the plurality of trim codes are indexed by a binary value equal to corresponding temperatures of plurality of the temperatures truncating a number of digits equal to the power minus one.

11. The apparatus of claim 10, wherein the interval comprises 8.

12. The apparatus of claim 11, wherein each of the plurality of trim codes is equal to a corresponding temperature code truncating at least two least significant digits of the corresponding temperature code.

13. A method comprising:
receiving, at a decoder, a temperature code of a plurality of temperature codes;
receiving, at the decoder, a plurality of trim codes each corresponding to a temperature code;
selecting, in the decoder, two closest trim codes of the plurality of trim codes closest to the temperature code;
outputting, from the decoder and to decoder and adder circuitry, the two closest trim codes;
calculating, in the decoder and adder circuitry, an output trim code based at least in part on the two closest trim codes; and
outputting the output trim code.

14. The method of claim 13, comprising:
receiving the output trim code;
generating a generated voltage to a level based at least in part on the output trim code; and
outputting the generated voltage.

15. The method of claim 13, wherein the plurality of trim codes corresponds to a subset of the plurality of temperatures, wherein the subset includes temperatures spaced apart by an interval comprising an integer greater than one.

16. The method of claim 15, wherein calculating the output trim code comprises using the following equation:

$$\text{Trim} = \frac{A*(\text{Temp}_{sub}) + B*(\text{Interval} - \text{Temp}_{sub})}{\text{Interval}},$$

where Trim is the output trim code, A is a first trim code of the two closest trim codes, B is a second trim code of the two closest trim codes, Interval is the interval, and $\text{Temp}_{sub}$ is a distance between the temperature code and one of the two closest trim codes.

17. The method of claim 15, wherein the interval is $2^n$, wherein n is an integer.

18. The method of claim 17, wherein a length of the trim codes of the plurality of trim codes is equal to a length of the temperature code minus n plus one.

19. A semiconductor device, comprising:
a decoder configured to receive a first value of a first parameter and a plurality of trim codes each corresponding to one of a plurality of values of the first parameter, wherein the plurality of trim codes comprises less precision than the plurality of values of the first parameter;
decoder and adder circuitry configured to:
receive the first value from the decoder;
receive two closest trim codes of the plurality of trim codes corresponding to two closest values of the plurality of values of the first parameter that are closest to the first value;
calculate an output trim code based at least in part on the two closest trim codes; and
output the output trim code to control a second parameter.

20. The semiconductor device of claim 19, wherein the first parameter comprises temperature, and the second parameter comprises a voltage level for a voltage to be used in the semiconductor device.

* * * * *